(12) United States Patent
Lee (10) Patent No.: US 11,870,367 B2
(45) Date of Patent: Jan. 9, 2024

(54) DYNAMIC ADAPTIVE ENERGY HARVESTING APPARATUS

(71) Applicant: UNIVERSITY OF MARYLAND, BALTIMORE COUNTY, Baltimore, MD (US)

(72) Inventor: Soobum Lee, Woodstock, MD (US)

(73) Assignee: UNIVERSITY OF MARYLAND, BALTIMORE COUNTY, Baltimore, MD (US)

(*) Notice: Subject to any disclaimer, the term of this patent is extended or adjusted under 35 U.S.C. 154(b) by 400 days.

(21) Appl. No.: 17/125,206

(22) Filed: Dec. 17, 2020

(65) Prior Publication Data

US 2021/0184602 A1 Jun. 17, 2021

Related U.S. Application Data

(60) Provisional application No. 62/949,062, filed on Dec. 17, 2019.

(51) Int. Cl.
*H02N 2/18* (2006.01)
*F03G 7/08* (2006.01)
*H10N 30/30* (2023.01)

(52) U.S. Cl.
CPC .............. *H02N 2/186* (2013.01); *F03G 7/08* (2013.01); *H10N 30/306* (2023.02)

(58) Field of Classification Search
CPC .... F03G 3/087–094; F03G 3/097; F03G 3/08; F03G 3/06; F03G 5/06; F03G 5/061; F03G 5/062; F03G 5/063; F03G 5/065; F03G 5/066; F03G 5/08; F03G 5/086; F03G 5/089; F03G 5/103; F03G 7/002; F03G 7/025; F03G 7/0252; F03G 7/029; F03G 7/06145; F03G 7/062; F03G 7/063; F03G 7/0633; F03G 7/064; F03G 7/0641; F03G 7/08; F03G 7/081; F03G 7/104; F03G 7/107; F03G 7/111; F03G 7/115; F03G 7/135; F03D 9/10; F03D 9/11; F03D 9/12; F03D 9/13; F03D 9/25; F03D 9/255; F03D 9/257; F03D 80/80; F03D 80/82; F03D 80/88; H10N 30/00–886

See application file for complete search history.

(56) References Cited

U.S. PATENT DOCUMENTS 10,008,660 B2 * 6/2018 Zawada ................. H02K 35/02
2011/0193350 A1 8/2011 Rastegar et al.
(Continued)

FOREIGN PATENT DOCUMENTS

CN 103259453 A * 8/2013

OTHER PUBLICATIONS

CN-103259453-A translation (Year: 2013).*
(Continued)

*Primary Examiner* — Mickey H France
(74) *Attorney, Agent, or Firm* — Tristan A. Fuierer; Casimir Jones, SC (57) ABSTRACT

Energy harvesters (EH) which can effectively harvest wasted vibrational/kinematic energy and convert it into electrical energy for battery-free sensor operation are described herein. The target application of the energy harvesters includes powering wireless sensors used for wind turbine blade structural monitoring.

20 Claims, 7 Drawing Sheets

(56) References Cited

U.S. PATENT DOCUMENTS

2018/0355840 A1* 12/2018 Hsu .................. F03B 17/06
2020/0208616 A1    7/2020 Lee

OTHER PUBLICATIONS

Chen, Nan, et al.; "Alternating Resistive Impedance Matching for an Impact-Type Microwind Piezoelectric Energy Harvester," IEEE Transactions on Industrial Electronics, 2018, vol. 65, pp. 7374-7382_ABSTRACT Only.

Nezami, Saman, et al.; "Design of a disk-swing driven piezoelectric energy harvester for slow rotary system application," Smart Mater. Struct., 2019, vol. 28, 074001.

Nezami, Saman, et al.; "Nonlinear Dynamics of a Rotary Energy Harvester With a Double Frequency Up- Conversion mechanism," Journal of Computational and Nonlinear Dynamics, 2020, DOI: 10.1115/1.4047238.

Knight, C., et al.; 2008, "Energy options for wireless sensor nodes," Sensors, 8(12), pp. 8037-8066.

Zhu, D., 2011, Vibration energy harvesting: machinery vibration, human movement and flow induced vibration, InTech. www.intechopen.com, Sustainable Energy Harvesting Technologies—Past, Present and Future, 25-54.

Glynne-Jones, P., et al.; 2004, "An electromagnetic, vibration powered generator for intelligent sensor systems," Sensors and Actuators A—Physical, 110(1-3), pp. 344-349.

Mitcheson, P. D.; 2004, "MEMS electrostatic micropower generator for low frequency operation," Sensors and Actuators A—Physical, 115(2-3), pp. 523-529.

Erturk, A., and Inman, D. J., 2011, Piezoelectric energy harvesting, John Wiley & Sons (Split into two separate documents for the upload).

Peigney, M.; 2013, "Piezoelectric energy harvesting from traffic-induced bridge vibrations," Smart Materials and Structures, 22(9), 095019.

Wang, D.-A., et al.; 2012, "Electromagnetic energy harvesting from vibrations induced by Kármán vortex street," Mechatronics, 22(6), pp. 746-756.

Jung, H. J., et al.; 2015, "Design and optimization of piezoelectric impact-based micro wind energy harvester for wireless sensor network," Sensors and Actuators A: Physical, 222, pp. 314-321.

Nagode, C., et al.; "Effective energy harvesting devices for railroad applications," Proc. SPIE Smart Structures and Materials+ Nondestructive Evaluation and Health Monitoring, International Society for Optics and Photonics, pp. 76430X-76430X-76410; Abstract Only.

Anton, S. R., et al; 2007, "A review of power harvesting using piezoelectric materials (2003-2006)," Smart Materials & Structures, 16(3), pp. R1-R21.

Zhu, D. B., et al.; 2010, "Strategies for increasing the operating frequency range of vibration energy harvesters: a review," Measurement Science and Technology, 21(2), 022001.

Chen, N., et al.; 2017, "A piezoelectric impact-induced vibration cantilever energy harvester from speed bump with a low-power power management circuit," Sensors and Actuators A—Physical, 254, pp. 134-144.

Jung, H. J., et al.; 2016, "Hybrid-type (d(33) and d(31)) impact-based piezoelectric hydroelectric energy harvester for watt-level electrical devices," Sensors and Actuators A—Physical, 245, pp. 40-48.

Fang, S. T., et al.; 2019, "A music-box-like extended rotational plucking energy harvester with multiple piezoelectric cantilevers," Applied Physics Letters, 114(23), DOI: 10.1063/1.5098439.

Gu, L., and Livermore, C., 2011, "Impact-driven, frequency up-converting coupled vibration energy harvesting device for low frequency operation," Smart Materials and Structures, 20(4), 045004 (10pp).

Kuang, Y., et al.; 2016, "Design and characterisation of a piezoelectric kneejoint energy harvester with frequency up-conversion through magnetic plucking," Smart Materials and Structures, 25(8), 085029.

Luong, H. T., et al; 2012, "Use of a magnetic force exciter to vibrate a piezocomposite generating element in a small-scale windmill," Smart Materials and Structures, 21(2), 025017.

Pillatsch, P., et al.; 2014, "A piezoelectric frequency up converting energy harvester with rotating proof mass for human body applications," Sensors and Actuators a—Physical, 206, pp. 178-185.

Fu, H. L., et al.; 2017, "A methodology for low-speed broadband rotational energy harvesting using piezoelectric transduction and frequency up-conversion," Energy, 125, pp. 152-161.

R. J. M. Vullers, et al.; "Energy harvesting for autonomous wireless sensor networks," Solid-State Circuits Magazine, IEEE, vol. 2, pp. 29-38; Abstract Only.

E. K. Reilly, et al.; "A study of ambient vibrations for piezoelectric energy conversion," Proc. PowerMEMS 2009, pp. 312-315, 2009.

M. C. Reichenbach, "Evaluating vehicular-induced vibrations of typical highway bridges for energy harvesting applications," MS, The University of Texas at Austin, MS Thesis 2012.

T. V. Galchev, et al.; "Harvesting traffic-induced vibrations for structural health monitoring of bridges," Journal of Micromechanics and Microengineering, vol. 21, 104005, 2011.

Office Action, corresponding to U.S. Appl. No. 16/640,577, dated Nov. 14, 2022.

* cited by examiner

DYNAMIC ADAPTIVE ENERGY HARVESTING APPARATUS

CROSS REFERENCE TO RELATED APPLICATIONS

This application claims priority to U.S. Provisional Patent Application No. 62/949,062 filed on Dec. 17, 2019 in the name of Soobum Lee and entitled "Development of Dynamic Adaptive Energy Harvesting Mechanism," which is hereby incorporated by reference herein in its entirety.

FIELD

The present invention relates to an energy harvester apparatus and method of using same, wherein the apparatus can effectively harvest wasted vibrational/kinematic energy and convert it to electrical energy for battery-free structural sensor operation. The energy harvester apparatus can be used in a number of applications including, but not limited to, powering the wireless sensors used for wind turbine blade monitoring.

BACKGROUND OF THE INVENTION

There has been increasing attention and use of Energy Harvesters (EH) to power structural health monitoring systems in recent years. This is mostly because of the lower power consumption levels of recently developed wireless sensors that potentially can be powered by harvested energy available from their environment. Vibration is one of the ambient energy sources available in any moving structure with a high energy conversion rate [1, 2]. Several techniques have been developed to convert vibrations to electricity, such as electromagnetic, electrostatic, and piezoelectric EHs [3-5]. Among these methods, Piezoelectric Energy Harvesters (PEHs) have gained more attention because of their lightweight, high energy density, and conversion coefficient [5].

PEHs have significant potential to be used in a variety of applications, including bridges [6], pipelines [7], wind turbines [8], and railroad systems monitoring [9]. However, PEH systems with a cantilevered beam usually show only modest performance when it comes to capturing vibration energy at their resonant frequency [10]. In general, vibration frequency available in large rotary structures (e.g., wind turbine blades) is less than 1 Hz (60 rpm) and is variable, which makes it challenging to harvest a practical amount of power [11]. Also, the conventional piezoelectric energy harvesters have a single and narrow frequency bandwidth with a high resonant frequency. To address these shortcomings, several studies have been conducted [12] such as an array of EHs with a different resonant frequency, bi-stable structures, and large inertial mass. In recent studies impact mechanisms were implemented in PEH design to facilitate frequency up-conversion technique that converts a low and broadband range of frequency [13-15]. Gu and Livermore used an impact-driven PEH in which low frequency (8.2 Hz) plucking can excite the PEH beam with the high resonant frequency (293 Hz). The results of their mathematical modeling and experimental tests showed that utilizing the frequency up-conversion technique could generate 13 times higher power density than its conventional counterpart [16]. To eliminate energy loss and mechanical wear due to direct impact, a magnetic plucking force is implemented in PEH designs as an alternative to the mechanical impact mechanism [17, 18]. Pillastsch et al. implemented a magnetic excitation force to induce impulse on the tip of the PEH beam with a resonant frequency of 400 Hz from human limb motion that was modeled as a rotating pendulum with the frequency of 5.6 Hz [19]. Fu and Yeatman used an analytical method to model the magnetic coupling force in their proposed EH design. They then verified their model with an experimental study to show that the EH can generate considerable power in a wide range of rotational frequencies (30 Hz to 80 Hz) [20].

The present inventor previously demonstrated an energy harvester having a disk axle that was perpendicular to the blade span, regardless of the pitch angle [21]. Disadvantageously, using this configuration, the disk did not drop by the gravitational force when the centrifugal force effect is relatively high, and the harvesting performance significantly reduced at high rpm of the blade. To summarize, increased blade speed did not guarantee an increased power level using this energy harvester.

A new disk design is introduced herein wherein the disk axle is substantially parallel to the blade span of a rotary structure and the blade's centrifugal effect is eliminated in theory. Using this new design, an increase in energy harvesting performance can be achieved with increasing blade rpm. This result opens a possible development of energy harvester that is not adversely affected by increased centrifugal force.

SUMMARY OF THE INVENTION

In one aspect, a piezoelectric energy harvester (PEH) is described, said PEH comprising a piezoelectric cantilever beam and a disk, wherein the disk rotates about a disk axle and comprises a first magnet and optionally an unbalanced mass, and wherein the piezoelectric cantilever beam comprises a second magnet positioned on a tip of the piezoelectric cantilever beam, wherein during every rotation of the disk, the first magnet exerts a force on the second magnet on the piezoelectric cantilever tip such that the cantilever beam vibrates and generates electrical energy.

In another aspect, a rotary structure comprising at least two blades and at least one piezoelectric energy harvester (PEH) is described, wherein the PEH comprises a piezoelectric cantilever beam and a disk, wherein the disk rotates about a disk axle and comprises a first magnet and optionally an unbalanced mass, and wherein the piezoelectric cantilever beam comprises a second magnet positioned on a tip of the piezoelectric cantilever beam, wherein during every spin of the at least two blades of the rotary structure, the disk rotates and the first magnet exerts a force on the second magnet on the cantilever tip such that the piezoelectric cantilever beam vibrates and generates electrical energy.

In a further aspect, a PEH mechanism is described, said PEH mechanism comprising a housing and a frame which are rotatably attached at a hinge point, wherein the housing comprises a PEH device and optionally a mass, and wherein the housing can rotate about the hinge point relative to the frame, wherein the PEH device comprises a piezoelectric cantilever beam and a disk, wherein the disk rotates about a disk axle and comprises a first magnet and optionally an unbalanced mass, and wherein the piezoelectric cantilever beam comprises a second magnet positioned on a tip of the piezoelectric cantilever beam, wherein during every rotation of the disk, the first magnet exerts a force on the second magnet on the piezoelectric cantilever tip such that the cantilever beam vibrates and generates electrical energy.

In still another aspect, a method of generating sustainable electrical energy is described, said method comprising harvesting the energy from a rotary structure and converting it to electrical energy, said method comprising positioning the PEH of claim 1 in or on a blade of a rotary structure, and connecting the PEH to a power management circuit and a storage unit, wherein the vibrational/kinematic energy of the rotary structure is converted to sustainable battery-free electrical energy.

Other aspects, features and embodiments of the invention will be more fully apparent from the ensuing disclosure and appended claims.

DETAILED DESCRIPTION, AND PREFERRED EMBODIMENTS THEREOF

The present inventor previously introduced a practical energy harvester (EH) in International Patent Application PCT/US2018/047505 filed on Aug. 22, 2018, which is hereby incorporated by reference herein in its entirety, wherein the EH effectively harvests wasted vibrational/kinematic energy and converts it to electrical energy. The target application of the energy harvesters includes, but is not limited to, powering the wireless sensors used for wind turbine blade monitoring.

As defined herein, a "blade span" corresponds to the longitudinal span of a blade of a rotary structure.

As defined herein, "substantially parallel" corresponds to parallel ±5° of parallel, preferably parallel ±2° of parallel, more preferably parallel ±1° of parallel, and most preferably parallel ±0.5° of parallel.

As defined herein, a rotary structure includes any structure comprising rotating blades such as a wind turbine. In addition, a rotary structure can be any object that spins about a central axis, for example, amusement park rides, cranks, and wheels.

In this application, a nonlinear energy harvester governed by gravity and magnetic force is disclosed. In the proposed design, a cantilevered PEH beam is excited by a magnetic plucking mechanism that includes a swinging unbalanced disk to realize frequency up-conversion. The EH has two degrees of freedom from a rotating disk and the cantilevered beam. The dynamic of this mechanism is governed by gravity and magnetic force, and the mechanism is designed to utilize energy from large-scale machinery that rotates at a low speed (e.g. ~0.25 Hz or ~15 rpm) such as wind turbine blades. During a full rotation of the blade, the orientation of the harvester changes while the gravity direction is fixed. A prototype of the EH is built and simulation results are experimentally verified. Also, a possible application of this energy harvester to power a wireless sensor node on a large-scale wind turbine blade is discussed.

The EH device described herein converts slow mechanical rotation into piezoelectric vibration using gravity force and magnetic repelling force. The energy harvester device comprises a disk and a piezoelectric cantilevered beam. The disk comprises an unbalanced mass which swings on a rotating object (e.g., wind turbine blade) and two magnets attached to both the piezoelectric cantilevered beam and the disk can transfer the kinetic energy of the disk to the piezoelectric cantilevered beam without physical contact.

Figure 1A:
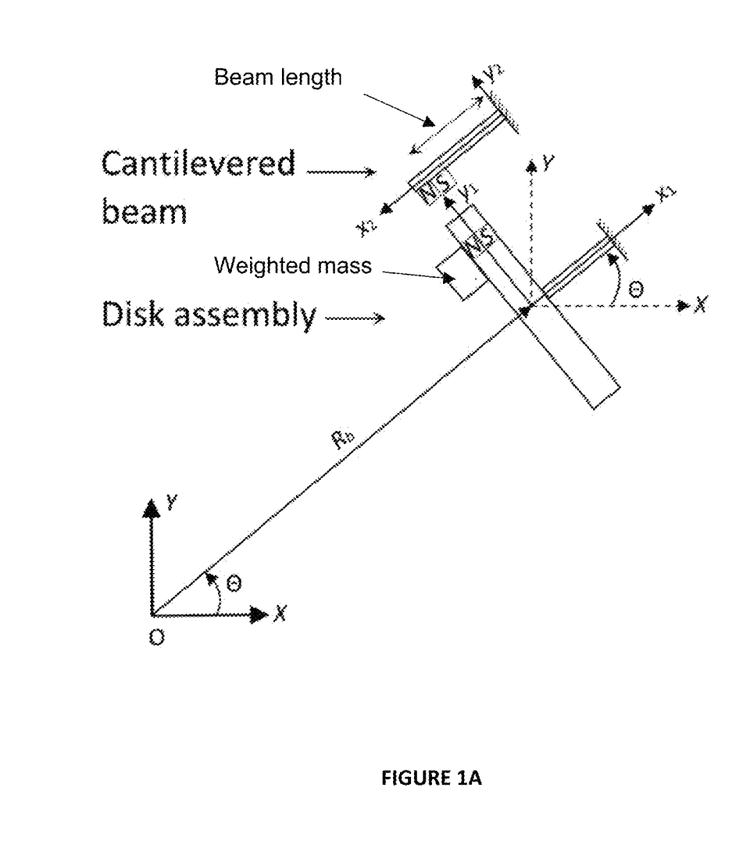
FIG. 1A is a schematic view of the harvester with respect to the global coordinate (X, Y, Z).
Figure 1B:
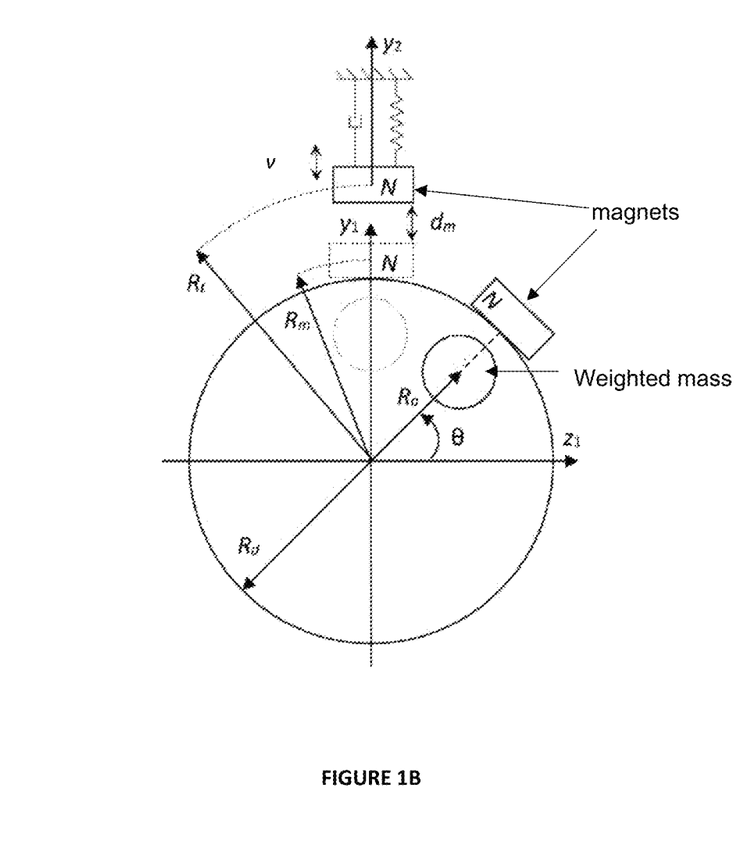
FIG. 1B is a schematic view of the harvester with respect to the local coordinate ($x_1, y_1$).

FIGS. 1A and 1B are schematic views of the EH device described herein. In FIG. 1A, the view of the EH device with respect to the global coordinate (X, Y, Z) at the center of the rotation of the blade, wherein Θ describes the blade orientation with respect to global coordinate (X, Y, Z), $m_a$ is the attached mass, and the poles of two magnets are shown. The disk assembly comprises a first magnet and an optional weighted mass. When present, the center of the first magnet and the center of the weighted mass are both positioned at the same angle relative to local coordinates and the center of rotation of the disk (see for example, θ in FIG. 1B). The cantilevered beam comprises the second magnet, positioned on it's tip. FIG. 1B is a view of the EH device with respect to the local coordinate ($x_1$, $y_1$) having two local coordinate systems fixed on the blade: (i) ($x_1$, $y_1$, $z_1$) at the center of rotation of the disk; and (ii) ($x_2$, $y_2$, $z_2$) at the fixed end of the cantilevered PEH beam. In FIG. 1B, θ is the angular position of the attached mass and magnet with respect to the local coordinate ($x_1$, $y_1$, $z_1$), v is the vibration of the PEH with respect to the local coordinate system ($x_2$, $y_2$, $z_2$), $R_m$ is the distance from the center of the disk to the outer surface of the magnet attached to the disk, $d_m$ is the gap between the two magnets as defined in $R_r=(R_m+d_m)$, $R_a$ is the distance from the center of the disk to the center of the mass, and $R_a$ is the distance from the center of the disk to the outer edge of the disk.

In a first aspect, an energy harvester device having significant power output regardless of the rotational speed of a rotating object, e.g., a wind turbine, is disclosed. The energy harvester is contactless, comprising a piezoelectric cantilever beam that is excited at its free tip by gravity force and magnetic repelling force to generate vibrations. Piezoelectric energy harvesters (PEHs) scavenge widely available wasted vibrational energy and reuse it for small electronic operations such as for wireless sensors (e.g., automation sensors, monitoring sensors) [22-25].

Figure 5:
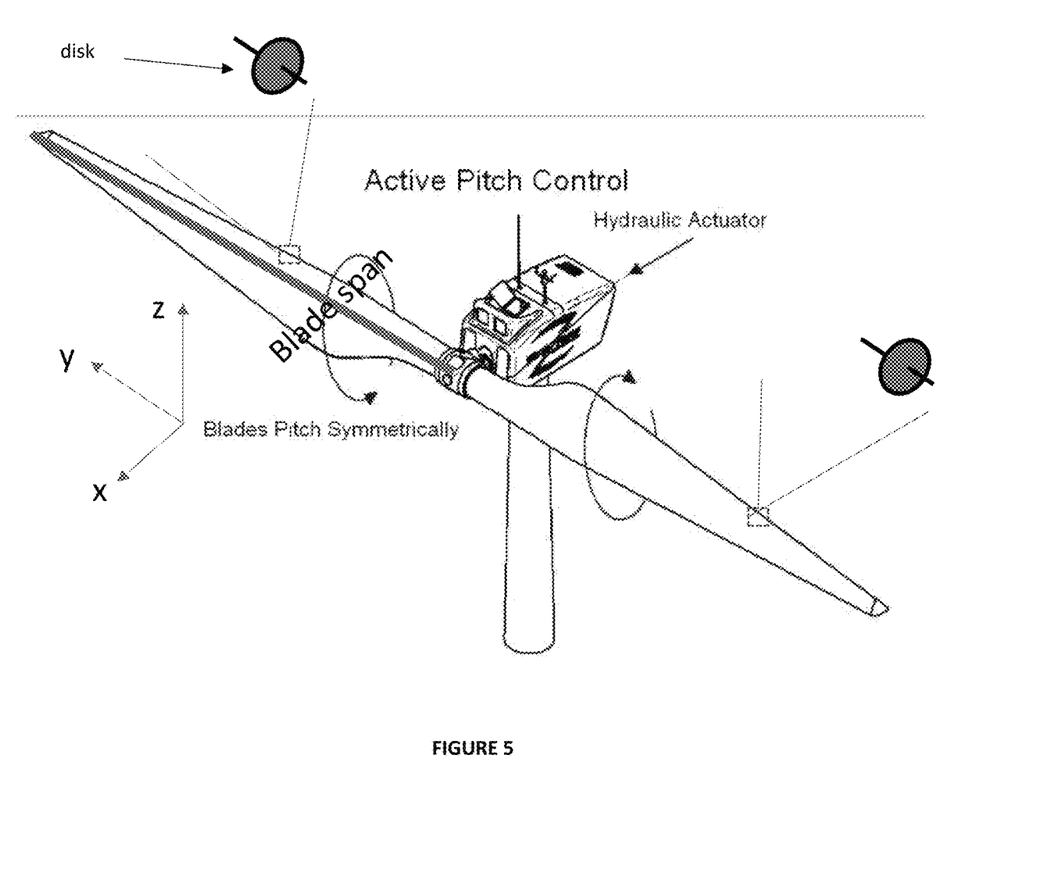
FIG. 5 is a schematic showing that the disk axle remains parallel to the blade span of the rotary structure regardless of the blade pitch angle.

The PEH device comprises a piezoelectric cantilever beam and a disk, wherein the disk comprises a first magnet and optionally an unbalanced mass and the disk rotates about a disk axle, and wherein the piezoelectric cantilever beam comprises a second magnet positioned on a tip of the piezoelectric cantilever beam. As defined herein, a "disk" can be substantially circular having a center of rotation at the geometric center. The "disk" can be eccentric, wherein the center of rotation is off-center. Alternatively, the "disk" can have a substantially elliptical shape so long as it can rotate and can excite the harvester. As indicated, the disk can comprise an "unbalanced mass," which can be a removeable object that is added to the disk or alternatively, a region where excess mass is present in the disk, for example, a weighted mass is embedded in the disk during manufacturing, wherein the density of the weighted mass is greater than the density of the disk material. In another embodiment, the disk is manufactured using a mold, wherein the mold includes a region where excess mass can be provided without embedding a weighted mass. It should also be appreciated that in some circumstances, the first magnet alone can provide the mass needed and therefore no unbalanced mass needs to be included in or on the disk. Once mounted on a rotary structure (e.g., a wind turbine blade), the unbalanced mass (or first magnet if no unbalanced mass) on the disk swings as the blade of the rotary structure spins about the blade axle and the two magnets transfer the kinetic energy of the disk to the piezoelectric cantilevered beam without physical contact. In one embodiment, the PEH device is mounted on the blade of the rotary structure such that the disk axle is substantially parallel to a blade span of the rotary structure (e.g., as shown in FIG. 5). It will be appreciated by the person skilled in the art that the disk comprises a bearing for easier rotation about the disk axle.

An example of the placement of the PEH device on (or within) a rotary structure blade as well as the normal operation of the wind turbine is shown in FIG. 5. The PEH device can be placed anywhere on the rotary structure blade. It is appreciated by the person skilled in the art that the rotary structure comprises at least two blades.

Figure 6A:
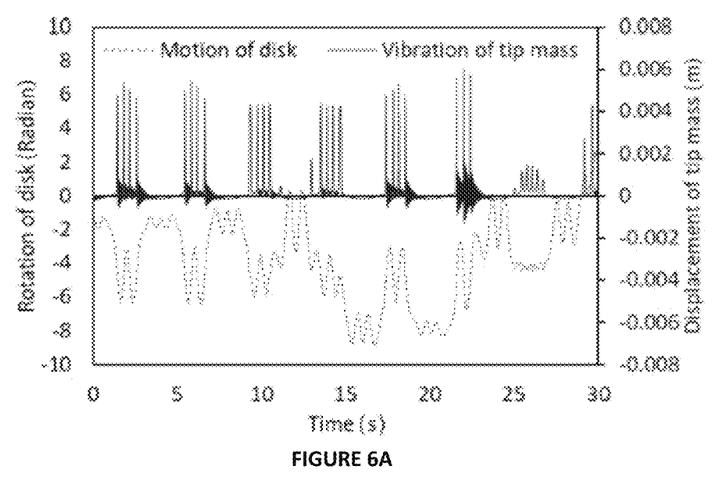
FIG. 6A illustrates the motion of the disk and the vibration of the tip mass of the EH at 15 rpm as a function of time.
Figure 6B:
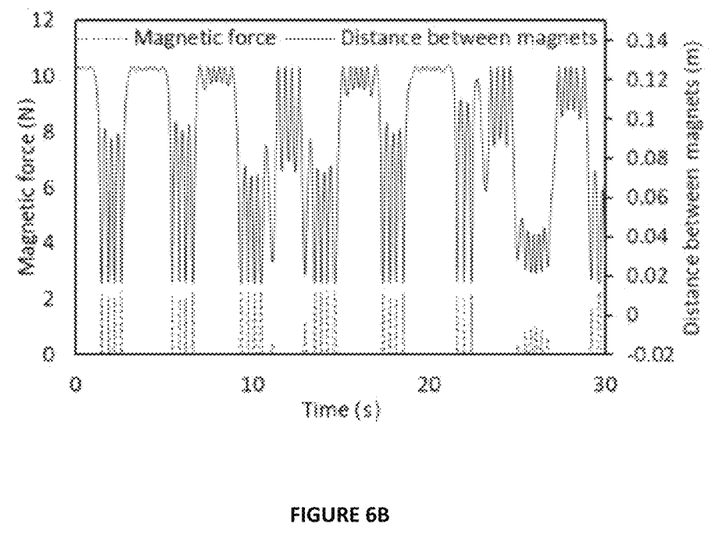
FIG. 6B illustrates the magnetic force and distance between the magnets of the EH at 15 rpm as a function of time.

During a full rotation or spin of the blade of the rotary structure, the orientation of the harvester changes while the gravity direction remains fixed. During each rotation of the blade, the direction of the gravity force on the local coordinate $(x_1, y_1)$ changes twice: $-y_1$ to $+y_1$ and $+y_1$ to $-y_1$. This direction change causes the disk to swing from one side to the other and generates impulses on the cantilevered beam. FIG. 6A shows these dynamics—the time responses of the disk's angular motion and the PEH beam's tip vibration. The disk's natural frequency is 1.4 Hz, but the actual swing vibration frequency can vary depending on $\Theta$ and $\theta$. The time responses of the magnetic force and the distance between the two magnets are plotted in FIG. 6B. When the blade angular position passes $\theta=90°$ (+Y), the disk mass returns close to the PEH beam ($+y_1$) due to gravity, and the distance between the PEH beam and the disk magnet decreases rapidly. Then the magnetic repelling force exponentially increases between the PEH beam and the disk, to induce magnetic plucking forces on the PEH beam. The magnetic force is increased while the distance is decreased, and vice versa, as shown in FIG. 6B. It was confirmed that the PEH device described herein vibrates at its natural frequency (during passing behavior) regardless of the angular velocity of the blade of the rotary structure. The frequency up-conversion mechanism using the disk swing enables the harvester to have a significant power output in a wide range of the blade rotational speeds. The energy harvester can be connected to a power management circuit and storage unit (e.g., a supercapacitor), which can thereby supply sustainable electrical energy to a wireless sensor with no battery replacement.

The detailed design specification such as piezoelectric cantilever beam shape and circuit components can be readily determined by the person skilled in the art using design optimization techniques. For example, a cantilever beam can comprise lead zirconate titanate (PZT) materials laminated as a patch on both sides of a shim, for example a shim comprising blue steel. To reduce the material deterioration, the piezoelectric cantilever can be entirely encased within an external shell or case that protects the piezoelectric harvester from the outdoor environment. This layered structure will protect the piezoelectric material and improve the structural durability.

An embodiment of the energy harvester of the first aspect comprises a wind turbine blade having the energy harvester described herein contained in or on said blade. The energy harvester can be connected to a power management circuit and storage unit (e.g., a supercapacitor), which can thereby supply sustainable electrical energy to a device that requires electrical energy, as readily understood by the person skilled in the art.

In a second aspect, a method of generating sustainable electrical energy, said method comprising harvesting the energy from a rotary structure and converting it to electrical energy, said method comprising positioning the PEH of claim 1 in or on a blade of a rotary structure, and connecting the PEH to a power management circuit and a storage unit, wherein the vibrational/kinematic energy of the rotary structure is converted to sustainable battery-free electrical energy. In one embodiment, the rotary structure is a wind turbine comprising at least one blade and the sustainable battery-free electrical energy is needed to operate a structural sensor.

The inventor's original harvester prototype, having the disk axle perpendicular to the blade span, generated power up to 2~3 mW (charged to the battery), but its performance was highly dependent on the centrifugal force from blade rotation. That is, when the centrifugal force is low (e.g., low blade speed or small radial location) compared to the gravitational force, the disk motion is governed primarily by the gravitational force and the disk is toward the ground. Because the piezoelectric energy harvester (PEH) moves with the blade, this guarantees periodic relative motion between the disk and the PEH as well as magnetic excitation to the PEH. The centrifugal force to some extent (similar amount to the gravitational force) helps facilitate more dynamic disk rotation (i.e., more than one disk rotation per blade rotation) and more frequent PEH excitation. However, when the centrifugal force becomes very high (e.g., due to high blade speed or large radial location), the disk mass tends to move radially outward and there is reduced relative motion between the disk and the PEH.

Figure 7A:
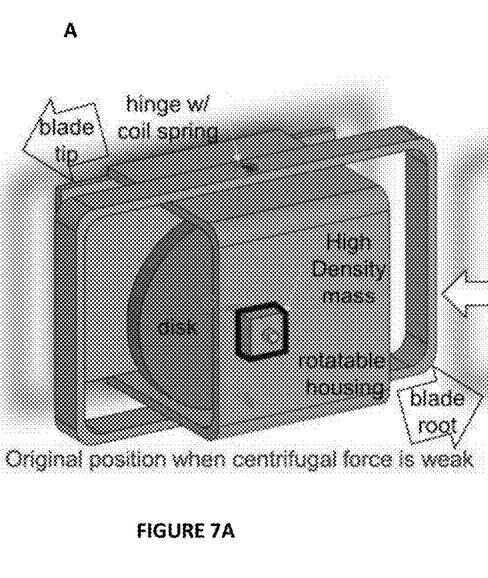
FIG. 7A illustrates a proposed embodiment of a EH wherein the disk axle is parallel to the blade axle at low centrifugal force.
Figure 7B:
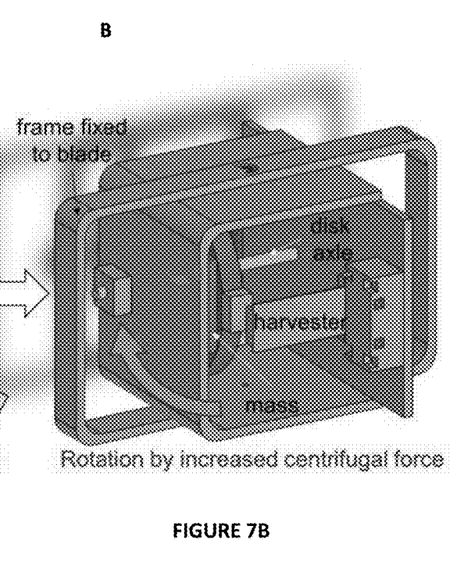
FIG. 7B illustrates a proposed embodiment of a EH wherein the disk axle is parallel to the blade span at high centrifugal force.

To improve the PEH performance across a range of centrifugal forces, a new mechanism that adaptively changes the disk orientation to eliminate the adverse centrifugal force effect at high blade rpm is proposed, as shown in FIG. 7. The design in FIG. 7 shows the different orientation of the mechanism when the centrifugal force changes. When the centrifugal force is low (e.g., low blade speed or small radial location) (FIG. 7A), a rotatable housing, maintained by a coil spring at the hinge joint, is positioned such that the disk axle is substantially parallel to the blade axle. In this case, the disk movement is affected by both the gravitational force and centrifugal force. However, as the centrifugal force increases, the rotatable housing rotates about the coil spring so that the disk axle is parallel to the blade span (FIG. 7B), so that the disk swing motion is negligibly affected by the centrifugal force. This concept is a purely passive mechanism and no additional power is required. Further, this concept works even when the blade pitch is changed because the disk axle remains parallel to the blade span of the rotary structure regardless of the blade pitch angle (see, e.g., FIG. 5). When the centrifugal force is reduced, the mechanism returns to its original orientation by hinge spring force.

It should be understood by the person skilled in the art that alternative embodiments of the EH are envisioned and this embodiment is not intended to limit the EH device in any way.

Accordingly, in a third aspect, a PEH mechanism is described, said PEH mechanism comprising a housing and a frame which are rotatably attached at a hinge point, wherein the housing comprises a PEH device as described herein and optionally a mass and wherein the housing can rotate about the hinge point relative to the frame. In one embodiment, the housing can rotate about the hinge point from an original, low centrifugal force position (0°) to a high centrifugal force position of no more than 90°. It should be appreciated that "low" and "high" centrifugal force are relative terms and vary depending on the rotary structure, etc. The mass attached to the housing, when present, can a high-density mass and can be positioned off center so as to assist in the rotation of the housing with increasing centrifugal force. The PEH device is positioned in the PEH mechanism such that upon attachment of the frame to a blade of the rotary structure, and during increased centrifugal force when rotation to the high centrifugal force position occurs, the disk axle is substantially parallel to the blade span of the rotary structure. In one embodiment, the hinge point includes a coil spring so that the housing returns to the original position once the centrifugal force decreases. Although shown as a wrapping around the PEH device on four sides in FIG. 7, it should be appreciated that the housing can completely envelop the PEH device.

Overall, a piezoelectric harvesting system has the advantage of being lightweight and thus does not affect the aerodynamics of the wind turbine blade.

EXAMPLE 1

A mathematical model was created and it was determined that the power output of the EH device described in FIGS. 1A and 1B increases with an increase of the rotational velocity of the host structure (calculations not shown herein).

Figure 2A:
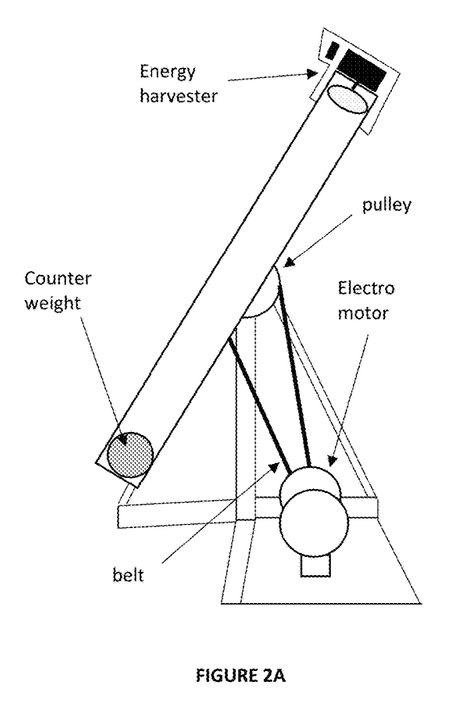
FIG. 2A is a photograph of the experimental test setup.
Figure 2B:
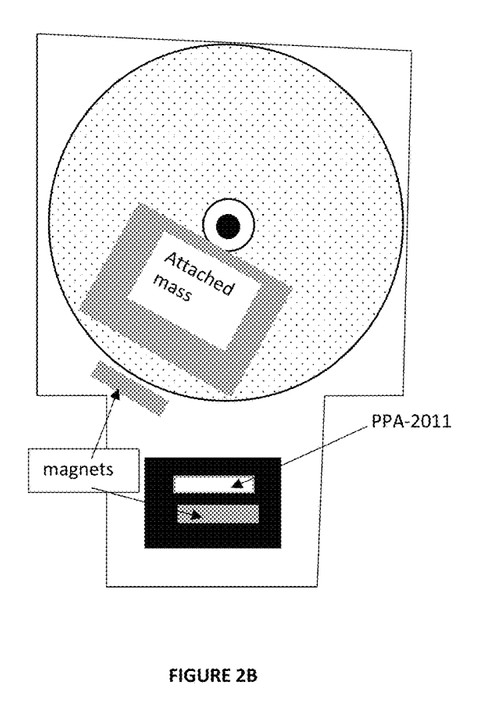
FIG. 2B is a photograph of the experimental energy harvester.

A prototype of the EH device and an experimental setup was built to evaluate the accuracy of the theoretical model as shown in FIGS. 2A and 2B. In this setup, two magnets, BX048 and BX048CS (K&J Magnetics, Inc., Pipersville, Pa., USA), were attached to the free tip of PPA-2011 harvester (Mide Corp., Woburn, Mass., USA) and on the circumference of the disk, respectively. The PPA-2011 was clamped to the board on the other end. A rectangular mass was attached to the disk as an unbalanced weight. The disk was mounted to a shaft at its center using a bearing. An electromotor (Marathon electric K258, Wausau, Wis., USA) was used with a variable frequency driver (Automation Direct GS2, Cumming, Ga., USA) to rotate the blade with controlled angular velocity. A laser tachometer (Neiko 20713A) was used to measure the rotational velocity of the blade during tests. The PEH was wired to an oscilloscope (Rigol DS1054) to measure the voltage output of the EH. It can be seen that the disk axle is preferably substantially parallel to the blade span of the rotary structure, which is thought to eliminate the centrifugal effect.

Figure 3A:
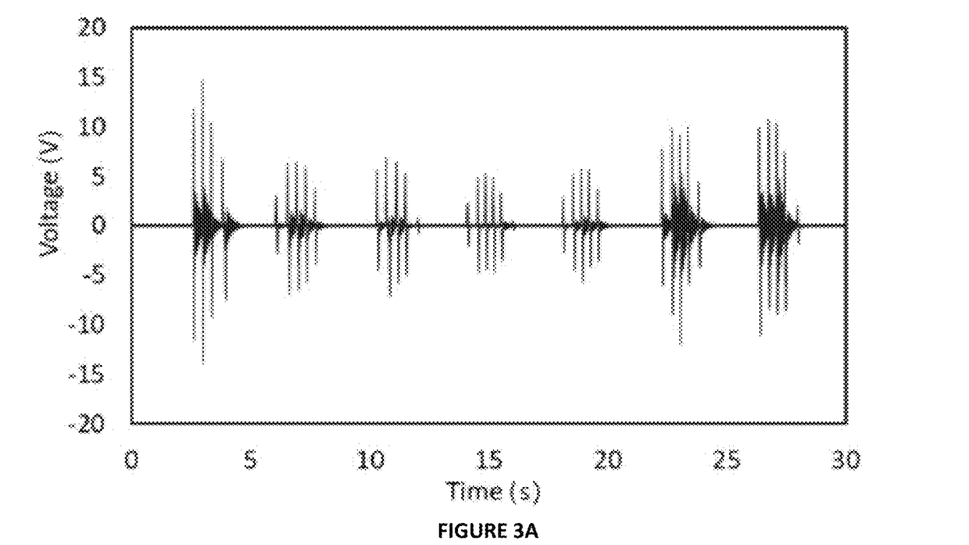
FIG. 3A illustrates the theoretical voltage output of the EH at 15 rpm blade rotation velocity.
Figure 3B:
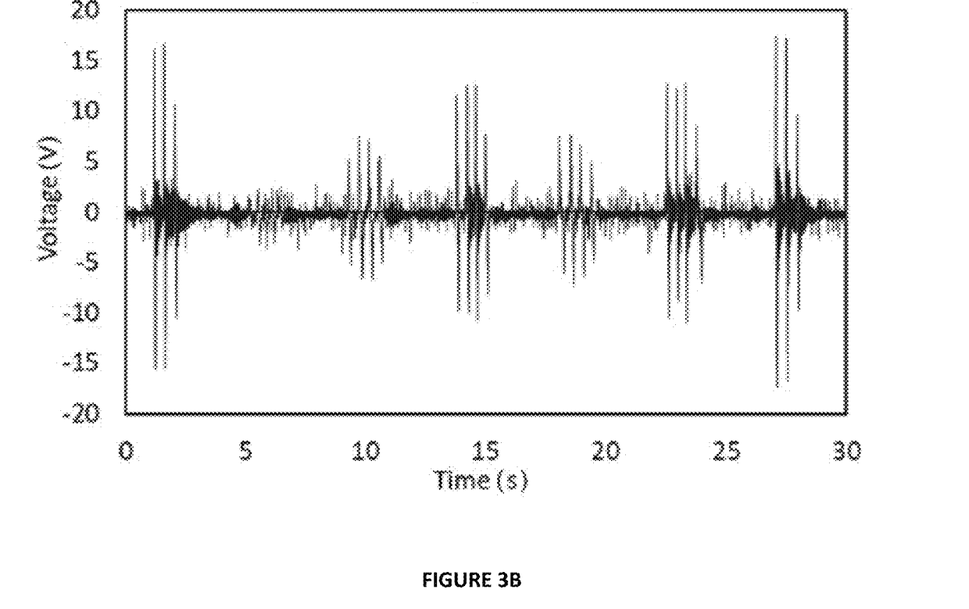
FIG. 3B illustrates the experimentally observed voltage output of the EH at 15 rpm blade rotation velocity.

FIGS. 3A and 3B show the theoretical (FIG. 3A) and experimental (FIG. 3B) voltage output of the EH at 15 rpm. The results demonstrate that the developed mathematical model can predict the amplitude and waveform of the voltage response with good accuracy. There are multiple flexible and moving parts in the structure of the test setup of FIG. 2 (e.g., clamps, bearing, blade, electromotor, and belt) that generate noise during the experiments. These parts are assumed as solid and are not considered in the theoretical model for simplicity.

Figure 4:
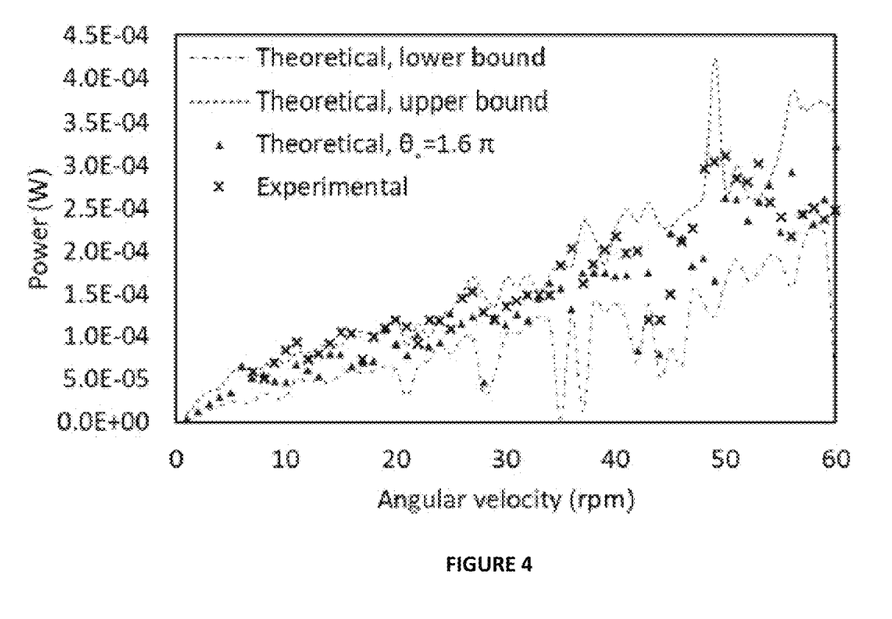
FIG. 4 illustrates the theoretical and experimental power output of the EH.

The average power output of the EH was calculated during 120 s at 5-60 rpm range and compared with the predicted values by the simulation model, as shown in FIG. 4. The results show that the experimental data is located between the theoretical simulation bounds. It can be seen that both of the results are following a consistent trend—the power level increases with the increase of angular velocity.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A piezoelectric energy harvester (PEH) comprising a piezoelectric cantilever beam and a disk, wherein the disk rotates about a disk axle and comprises a first magnet and optionally an unbalanced mass, and wherein the piezoelectric cantilever beam comprises a second magnet positioned on a tip of the piezoelectric cantilever beam, wherein during every rotation of the disk, the first magnet exerts a force on the second magnet on the piezoelectric cantilever tip such that the cantilever beam vibrates and generates electrical energy, and wherein when the piezoelectric energy harvester is placed in or on a blade of a rotary structure, the disk axle is substantially parallel to a blade span of the rotary structure.

2. The PEH of claim 1, comprising the unbalanced mass, wherein the unbalanced mass is an object on the disk or a region where excess mass is present in the disk.

3. The PEH of claim 1, wherein the rotary structure is a wind turbine.

4. The PEH of claim 2, wherein the disk is substantially circular or eccentric.

5. The PEH of claim 1, wherein the piezoelectric energy harvester is connected to a power management circuit and storage unit.

6. A rotary structure comprising at least two blades and at least one piezoelectric energy harvester (PEH), wherein the PEH comprises a piezoelectric cantilever beam and a disk, wherein the disk rotates about a disk axle and comprises a first magnet and optionally an unbalanced mass, and wherein the piezoelectric cantilever beam comprises a second magnet positioned on a tip of the piezoelectric cantilever beam, wherein during every spin of the at least two blades of the rotary structure, the disk rotates and the first magnet exerts a force on the second magnet on the cantilever tip such that the piezoelectric cantilever beam vibrates and generates electrical energy, and wherein the disk axle is substantially parallel to a blade span of the rotary structure.

7. The rotary structure of claim 6, wherein the rotary structure is a wind turbine.

8. The rotary structure of claim 6, wherein the piezoelectric energy harvester is connected to a power management circuit and storage unit.

9. The rotary structure of claim 6, wherein the disk is substantially circular or eccentric.

10. The rotary structure of claim 6, comprising the unbalanced mass, wherein the unbalanced mass is an object on the disk or a region where excess mass is present in the disk.

11. A PEH mechanism comprising a housing and a frame which are rotatably attached at a hinge point, wherein the housing comprises a PEH device and optionally a mass, and wherein the housing can rotate about the hinge point relative to the frame, wherein the PEH device comprises a piezoelectric cantilever beam and a disk, wherein the disk rotates about a disk axle and comprises a first magnet and optionally an unbalanced mass, and wherein the piezoelectric cantilever beam comprises a second magnet positioned on a tip of the piezoelectric cantilever beam, wherein during every rotation of the disk, the first magnet exerts a force on the second magnet on the piezoelectric cantilever tip such that the cantilever beam vibrates and generates electrical energy.

12. The PEH mechanism of claim 11, wherein the housing rotates about the hinge point from an original position (0°) to a second position of no more than 90° relative to the original position.

13. The PEH mechanism of claim 11 wherein the mass is high-density and is positioned off center on the housing.

14. The PEH mechanism of claim 12, wherein the PEH device is positioned in the PEH mechanism such that upon attachment of the frame to a blade of a rotary structure that has a low centrifugal force or is not rotating, the disk axle is substantially perpendicular to a blade span of the rotary structure, and when the blade of the rotary structure is rotating at a high centrifugal force, the housing rotates about the hinge point such that the disk axle is substantially parallel to the blade span.

15. The PEH mechanism of claim 11, wherein the hinge point includes a coil spring.

16. A method of generating sustainable electrical energy, said method comprising harvesting the energy from a rotary structure and converting it to electrical energy, said method comprising positioning the PEH of claim 1 in or on a blade of the rotary structure, and connecting the PEH to a power management circuit and a storage unit, wherein the vibrational/kinematic energy of the rotary structure is converted to sustainable battery-free electrical energy.

17. The PEH mechanism of claim 11, wherein the PEH device comprises the unbalanced mass, wherein the unbalanced mass is an object on the disk or a region where excess mass is present in the disk.

18. The PEH mechanism of claim 11, wherein the disk is substantially circular or eccentric.

19. The PEH mechanism of claim 11, wherein the PEH device is connected to a power management circuit and storage unit.

20. The method of claim 16, wherein the rotary structure is a wind turbine.

* * * * *